(12) United States Patent
Ishio

(10) Patent No.: US 7,253,601 B2
(45) Date of Patent: Aug. 7, 2007

(54) CURRENT SENSOR HAVING HALL ELEMENT

(75) Inventor: Seiichiro Ishio, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/448,810

(22) Filed: Jun. 8, 2006

(65) Prior Publication Data
US 2006/0284611 A1    Dec. 21, 2006

(30) Foreign Application Priority Data
Jun. 21, 2005   (JP) ............................. 2005-181091

(51) Int. Cl.
*G01R 15/20*    (2006.01)
(52) U.S. Cl. .............................. 324/117 H; 324/117 R
(58) Field of Classification Search ................ 324/770, 324/207.2, 117 H, 117 R, 529; 73/514.31
See application file for complete search history.

(56) References Cited

U.S. PATENT DOCUMENTS 5,572,058 A * 11/1996 Biard ......................... 257/421
6,184,679 B1 * 2/2001 Popovic et al. ............. 324/251
2002/0190703 A1 * 12/2002 Goto et al. ................. 324/117 H
2004/0201374 A1 * 10/2004 Kawase ..................... 324/117 R
2005/0030018 A1 * 2/2005 Shibahara et al. .......... 324/251
2005/0045359 A1 * 3/2005 Doogue et al. ............. 174/52.1
2005/0230770 A1    10/2005 Oohira

FOREIGN PATENT DOCUMENTS

JP    A-2003-262650    9/2003
JP    A-2004-257953    9/2004
JP    A-2006-013231    1/2006

* cited by examiner

*Primary Examiner*—Vinh Nguyen
*Assistant Examiner*—Joshua Benitez
(74) *Attorney, Agent, or Firm*—Posz Law Group, PLC

(57) ABSTRACT

A current sensor includes: a current path; a semiconductor substrate; and a Hall element on the substrate. The Hall element detects a magnetic flux in a magnetic field caused by a detection object current. The Hall element generates a Hall voltage corresponding to the magnetic flux when a driving current flowing in a direction perpendicular to the semiconductor substrate is supplied to the Hall element, and when the magnetic flux having a component parallel to the semiconductor substrate affects the Hall element. The current path is disposed on the semiconductor substrate. The current path is electrically isolated from the Hall element.

9 Claims, 3 Drawing Sheets

CURRENT SENSOR HAVING HALL ELEMENT

CROSS REFERENCE TO RELATED APPLICATION

This application is based on Japanese Patent Application No. 2005-181091 filed on Jun. 21, 2005, the disclosure of which is incorporated herein by reference.

FIELD OF THE INVENTION

The present invention relates to a current sensor having a Hall element.

BACKGROUND OF THE INVENTION

Conventionally, a current sensor having a lateral type Hall element for detecting current flowing through a current path is well known. The lateral type Hall element is formed on a semiconductor substrate, and the Hall element detects a magnetic flux in a vertical direction of the substrate. The current sensor detects the magnetic flux by using the Hall element in a case where the magnetic flux is generated in a magnetic field when the current as a detecting object flowing though the current path. In the current sensor, the current path passes through a magnetic field concentration core having a C-shape, and a sensor chip including the Hall element is mounted between two ends of the C-shape of the core. Thus, the magnetic flux generated between two ends of the core in the vertical direction is detected by the Hall element. In this case, the concentration core is necessary for the current sensor. Accordingly, the dimensions of the current sensor become larger.

In JP-A-2003-262650, a current sensor including a magnetic sensor has a magnetic field concentration plate. The magnetic sensor includes a lateral type Hall element, and the magnetic field concentration plate is mounted on a top of the magnetic sensor. The concentration plate made from soft magnetic material concentrates a magnetic flux. The Hall element is mounted between two ends of the concentration plate so that the Hall element detects the magnetic flux in the vertical direction of a substrate surface. Thus, the current sensor detects a current. In this case, the current sensor has no magnetic field concentration core; and therefore, the dimensions of the current sensor become smaller.

However, although the dimensions of the current sensor are small, the magnetic field concentration plate is necessary for the current sensor. Thus, since a magnetic field concentration member such as the concentration core and the concentration plate is required for the current sensor, minimization of the dimensions of the current sensor is limited by the dimensions of the concentration member.

Further, in order to detect the magnetic flux caused by the detection object of the current accurately, the positioning among the current path, the Hall element and the concentration member is required to be more accurate. If the positioning among these three elements is deviated, the detection accuracy is varied. Thus, the detection accuracy of the current sensor is reduced.

SUMMARY OF THE INVENTION

In view of the above-described problem, it is an object of the present disclosure to provide a current sensor having small dimensions and high detection accuracy.

According to an aspect of the present disclosure, a current sensor for detecting a detection object current includes: a current path for flowing the detection object current therethrough; a semiconductor substrate; and a Hall element disposed on a front side of the semiconductor substrate. The Hall element is capable of detecting a magnetic flux generated by a magnetic field, which is caused by the detection object current when the detection object current flows through the current path. The Hall element generates a Hall voltage corresponding to the magnetic flux when a driving current flowing in a direction perpendicular to the semiconductor substrate is supplied to the Hall element, and when the magnetic flux having a component parallel to the semiconductor substrate affects the Hall element. The current path is disposed on the front side or a back side of the semiconductor substrate. The current path is electrically isolated from the Hall element.

In the above sensor, the Hall element is a vertical type Hall element, and the sensor can detect the detection object current without a magnetic field concentration member. Thus, the dimensions of the sensor are minimized. Further, the positioning between the Hall element and the current path is much accurately determined. Thus, deviation of the positioning between the Hall element and the current path is restricted. Thus, the detection accuracy of the sensor is prevented from deviating. Accordingly, the sensor has small dimensions and high detection accuracy.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
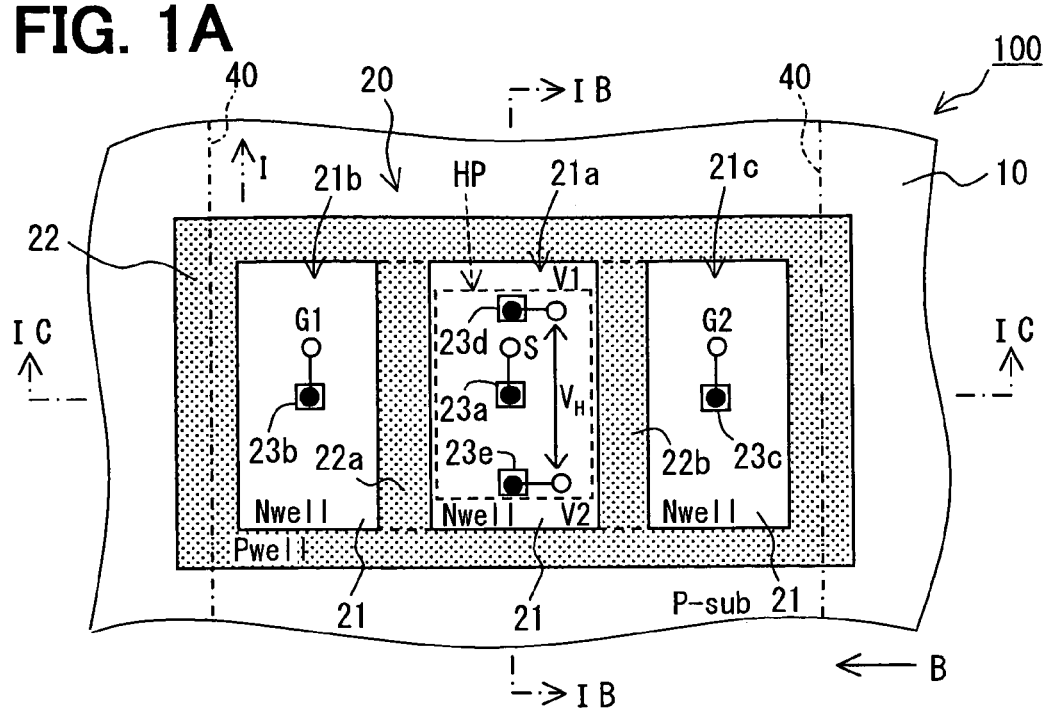
FIG. 1A is a plan view showing a current sensor according to a first embodiment of the present invention.
Figure 1B:
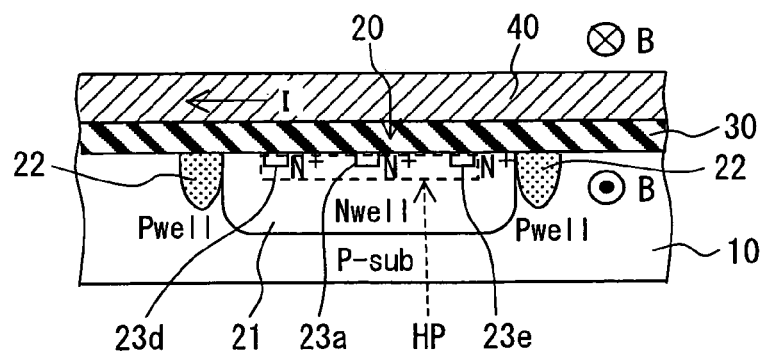
FIG. 1B is a cross sectional view showing the sensor taken along line IB-IB in FIG. 1A.
Figure 1C:
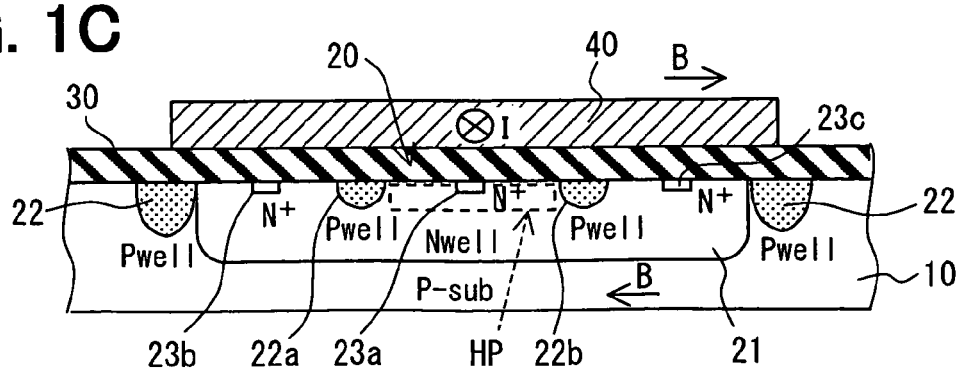
FIG. 1C is a cross sectional view showing the sensor taken along line IC-IC in FIG. 1A.

A current sensor 100 according to a first embodiment of the present invention is shown in FIGS. 1A to 1C. Here, in FIG. 1, an insulation layer 30 is not shown, and a wiring portion 40 surrounded with two dotted lines is transparently shown.

The current sensor 100 includes a semiconductor substrate 10, a Hall element 20 and a wiring portion 40. The Hall element 20 is formed on one side of the substrate 10. The wiring portion 40 is formed on the one side of the substrate 10 through the insulation layer 30. Here, the constitution of the Hall element and the manufacturing method of the hall element are described in US 2005/0,230, 770-A1.

In the sensor 100, the substrate 10 is made of a silicon substrate (i.e., P-sub) having a P conductive type. Specifically, the substrate has a (100)-crystal orientation surface as a cutting surface. By using the P-sub, an offset voltage caused by stress applied to the substrate 10 is reduced. Alternatively, the substrate 10 may be made of another material.

The Hall element 20 is a vertical type Hall element, which is formed in the substrate 10. The substrate 10 further includes a N conductive type semiconductor region 21 (i.e., N well) as a diffusion layer. An N conductive type impurity is introduced on the substrate surface of the substrate 10 so that the semiconductor region 21 is formed on the one side of the substrate 10. The semiconductor region 21 is surrounded with the substrate 10. The substrate 10 further includes a P conductive type diffusion separation wall 22 (i.e., P well) for separating the Hall element 20 from other elements of the substrate 10. A P conductive type impurity is introduced on a part of the substrate 10 so that the P well 22 is formed as a diffusion layer. Five contact regions 23a-23e are formed in an active region, which is surrounded with the diffusion separation wall 22. Each contact region 23a-23e is disposed on the surface of the semiconductor region 21. Impurity concentration on the surface of the semiconductor region 21 is selectively increased so that the contact region 23a-23e is formed as a $N^+$ conductive type diffusion layer.

Thus, excellent ohmic contact between the contact region 23a-23e and a wiring is obtained, the wiring being connected to the contact region 23a-23e. The contact region 23a-23e is electrically connected to a connection terminal S, G1, G2, V1, V2 through the wiring. A pair of the contact regions 23a, 23b and a pair of the contact regions 23a, 23c provide current supply pairs for supplying a driving current to the Hall element 20. A pair of the contact regions 23d, 23e corresponds to a pair of output terminals of the Hall element 20 for outputting a Hall voltage. In FIG. 1A, the connection terminal S, G1, G2, V1, V2 is connected to the contact region 23a-23e in the wiring portion 40. However, in actual, the connection terminal S, G1, G2, V1, V2 is connected to the contact region 23a-23e through the wiring portion 40 in an outside of the wiring portion 40.

The active region surrounded with the diffusion separation wall 22 includes a first separation wall 22a and a second separation wall 22b so that the active region is divided into three element regions 21a-21c. The first and second separation walls 22a, 22b have a P conductive type so that each element region 21a-21c and each separation wall 22, 22a, 22b provide a PN junction separation. The first and second separation walls 22a, 22b have a diffusion depth, which is shallower than a depth of the semiconductor region 21, as shown in FIG. 1C, so that a part of the semiconductor region 21 under the separation wall 22a, 22b is selectively narrowed. Thus, the part of the semiconductor region 21 near the bottom of the semiconductor region 21 provides a current path. Accordingly, each element region 21a-21c is electrically divided in a depth direction of the inside of the substrate 10.

Specifically, the contact regions 23a, 23d, 23e are formed in the element region 21a, the contact region 23b is formed in the element region 21b, and the contact region 23c is formed in the element region 21c. The contact region 23a is sandwiched between two contact regions 23b, 23c, and further, sandwiched between two contact regions 23d, 23e. A pair of the contact regions 23b, 23c is disposed perpendicularly to another pair of the contact regions 23d, 23e. Thus, the contact region 23a faces each of the contact regions 23b, 23c through the separation wall 22a, 22b. The contact region 23a faces each of the contact regions 23d, 23e without a separation wall.

In the Hall element 20, a Hall plate HP as a magnetic field detection region is formed of a region sandwiched between the contact regions 23d, 23e, the region which is shown as a dotted line in FIG. 1A. The Hall plate HP is electrically divided, and disposed in the element region 21a. The contact region 23a corresponding to one terminal of the current supply terminals is sandwiched between the contact regions 23d, 23e, which provide the Hall voltage output terminals. The contact regions 23b, 23c corresponding to the other terminals of the current supply terminals are disposed line-symmetric about the Hall voltage output terminals, i.e., a pair of the contact regions 23d, 23e. Accordingly, a Hall voltage, which is generated by a current flowing in a lateral direction of the Hall plate HP and flowing in parallel to the substrate surface, is cancelled. Thus, the magnetic flux as a detection object having a component parallel to the substrate surface is accurately detected by the Hall element 10. Further, since the first and second separation walls 22a, 22b are formed in the Hall element 10, the current flowing in the lateral direction of the substrate surface is disturbed by the separation walls 22a, 22b, so that the detection accuracy is much improved.

The insulation layer 30 insulates between the Hall element 20 and the wiring portion 40 electrically. The insulation layer 30 is formed on the semiconductor substrate 10 after the Hall element 20 is formed in the substrate 10. The insulation layer 30 is made of, for example, an oxide silicon film. The thickness of the insulation layer 30 is determined such that the magnetic flux having a component parallel to the substrate surface sufficiently affects the Hall plate HP in the Hall element 20. Here, the magnetic flux is generated by a magnetic field as a detection object when a detection object of the current flows through the wiring portion 40.

The wiring portion 40 is a current path for the current as a detection object passing through the wiring portion 40. The wiring portion 40 is integrally formed on the semiconductor substrate 10 through the insulation layer 30. The wiring portion 40 is made of, for example, copper. Thus, the current sensor 100 including the insulation layer 30 and the wiring portion 40 is formed by a semiconductor process so that a manufacturing process of the sensor 100 is simplified. Further, the insulation layer 30 and the wiring portion 40 are formed on the one side of the substrate 10, the one side on which the Hall element 20 is formed. Accordingly, the manufacturing process of the sensor 100 is much simplified. Furthermore, since the Hall element 20, the insulation layer 30 and the wiring portion 40 are formed on the same substrate 10, the Hall element 20 and the wiring portion 40 can be positioned accurately. Accordingly, the detection accuracy of the sensor is much improved.

As shown in FIG. 1A, the wiring portion 40 completely covers the semiconductor region 21 in the Hall element 20 in a direction perpendicular to a current flowing direction of the current I as the detection object. Accordingly, when the current I flows through the wiring portion 40, the Hall plate HP can detect stably the magnetic flux parallel to the substrate surface.

In the sensor 100, for example, when the driving current flows from the terminal S to the terminal G1, and/or from the terminal S to the terminal G2, the driving current flows from the contact region 13a formed on the surface of the substrate 10 to the contact region 13b, 13c through the Hall plate HP and the part of the N well 21 under the first or second separation wall 12a, 12b. Thus, in the Hall plate HP, the driving current having a vertical component perpendicular to the substrate 10 flows. In a case where the driving current is supplied in the Hall plate HP, and when the detection object current I flows through the wiring portion 40 and the magnetic field caused by the detection object current I affects the Hall plate HP, a Hall voltage $V_H$ is generated between the terminals V1, V2. Specifically, when the magnetic flux having a component parallel to the substrate surface in the magnetic field affects the Hall plate HP, the Hall voltage $V_H$ is generated in accordance with the magnetic flux by a Hall effect. The magnetic flux is shown as B in FIGS. 1B and 1C. On the basis of the following formulas F1 and F2, the detection object current I is obtained by measuring the Hall voltage signal.

$$V_H = (R_H I_o B/d)\cos\theta \quad (F1)$$

$$B = \mu_o I/2\pi r \quad (F2)$$

Here, $R_H$ represents a Hall coefficient, $I_o$ represents the driving current, d represents the thickness of the Hall plate HP, i.e., the distance between the separation walls 22a, 22b, θ represents an angle between the Hall element 20 and the magnetic field, $\mu_o$ represents a space permeability, i.e., $4\pi \times 10^{-7} N/A^2$, I represents the detection object current, and r represents a distance between the Hall plate HP and the wiring portion 40.

In the sensor 100, the Hall element 20 is a vertical type Hall element, and the wiring portion 40 is formed on the surface of the substrate 10. When the detection object current I flows through the current path, i.e., the wiring portion 40, the magnetic flux B having the component parallel to the substrate 10 is generated. Accordingly, since the sensor 100 includes no magnetic field concentration member, the dimensions of the sensor 100 can be minimized.

Further, the positioning of the wiring portion 40 and the Hall element 20 is appropriately determined in order to detect the magnetic flux B caused by the detection object current I accurately by the Hall element 20. The positioning accuracy of the wiring portion 40 and the Hall element 20 is improved. Thus, the sensor 100 has high positioning accuracy of the wiring portion 40 and the Hall element 20, so that the detection accuracy of the sensor 100 is improved. Specifically, deviation of the positioning accuracy of the wiring portion 40 and the Hall element 20 becomes small, so that deviation of the detection accuracy of the sensor 100 also becomes small.

Figure 2:
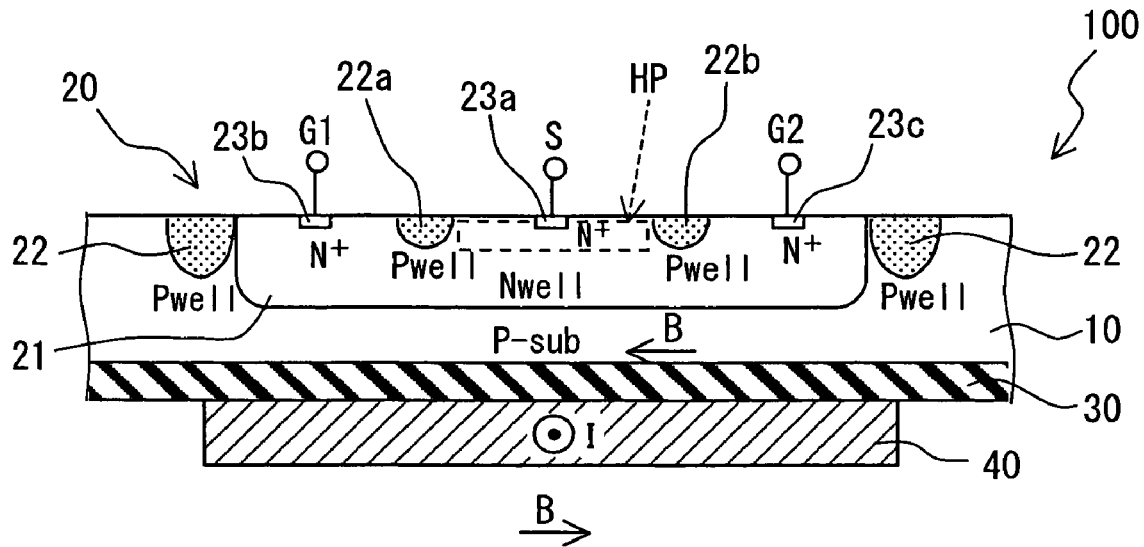
FIG. 2 is a cross sectional view showing a current sensor according to a first modification of the first embodiment.

In FIGS. 1A to 1C, the wiring portion 40 as the current path is formed on the one side of the substrate 10, on which the Hall element 20 is formed. However, the current path may be formed on a surface of the substrate 10 as long as the magnetic flux B having the component parallel to the substrate 10 affects the Hall plate HP when the detection object current I flows through the current path. For example, the wiring portion 40 may be formed on the back of the substrate 10, as shown in FIG. 2. In FIG. 2, the Hall element 20 is formed on the front of the substrate 10. In this case, a connection construction between the contact region 23a-23e and the connection terminal S, G1, G2, V1, V2 may be simplified.

Alternatively, the current path may be formed on both sides of the substrate 10.

Figure 3:
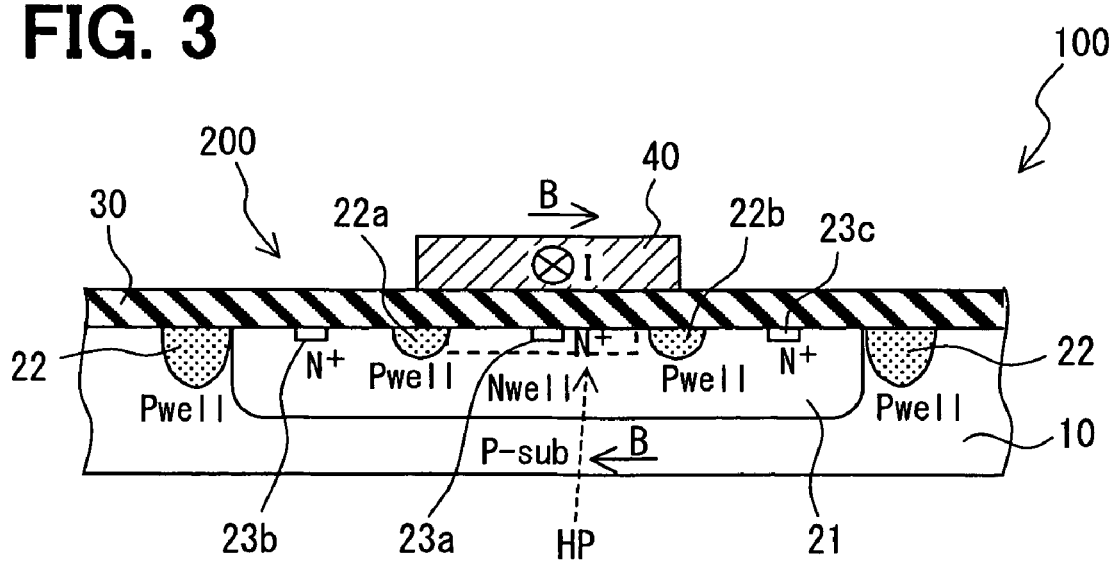
FIG. 3 is a cross sectional view showing a current sensor according to a second modification of the first embodiment.

In FIGS. 1A to 1C, the wiring portion 40 covers completely the semiconductor region 21 in the Hall element 20 in the direction perpendicular to the current flowing direction of the detection object current I. Alternatively, as shown in FIG. 3, the wiring portion 40 may cover at least the Hall plate HP as the magnetic field detection portion completely. Even in this case, the Hall element 20 can detect the magnetic flux B having the component parallel to the substrate 10 stably.

Although the Hall element 20 has a construction shown in FIGS. 1A to 1C, the Hall element 20 may have another construction other than FIGS. 1A to 1C as long as the Hall element 20 is a vertical type Hall element.

Second Embodiment

Figure 4:
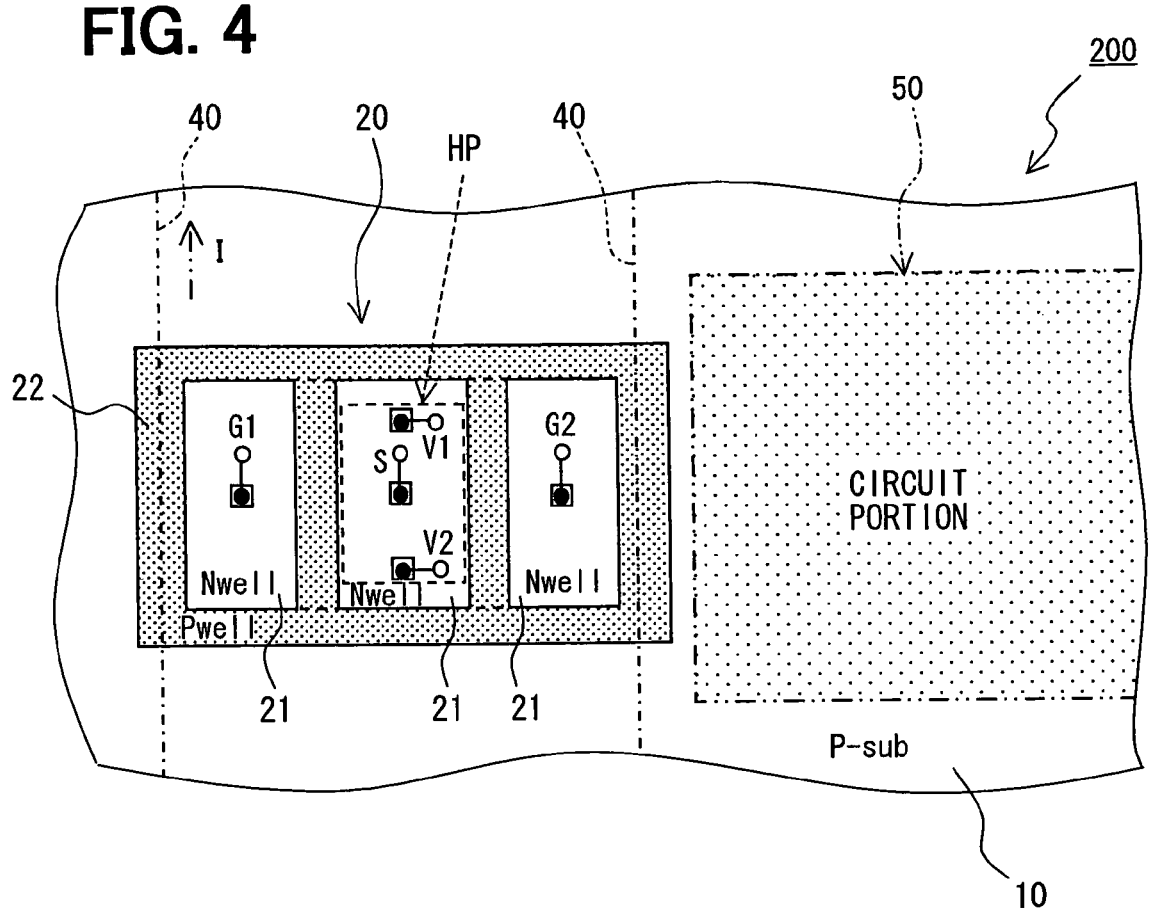
FIG. 4 is a plan view showing a current sensor according to a second embodiment of the present invention.

A current sensor 200 according to a second embodiment of the present invention is shown in FIG. 4. In FIG. 4, the insulation layer 30 is not shown on the substrate 10. Further, the wiring portion 40 on the insulation layer 30 is transparently shown.

The sensor 200 includes not only the Hall element 20 but also a processing circuit portion 50. The Hall element 20 and the processing circuit portion 50 are integrally formed on the same substrate 10. The processing circuit portion 50 includes a signal processing circuit and a current driving circuit. The signal processing circuit calculates the Hall voltage signal outputted from the Hall element 20, and the current driving circuit controls and supplies the driving current to the Hall element 20.

In this case, since the processing circuit portion 50 is integrated into the same substrate 10, in which the Hall element 20 is formed, the total dimensions of the sensor 200 become much smaller.

Third Embodiment

Figure 5:
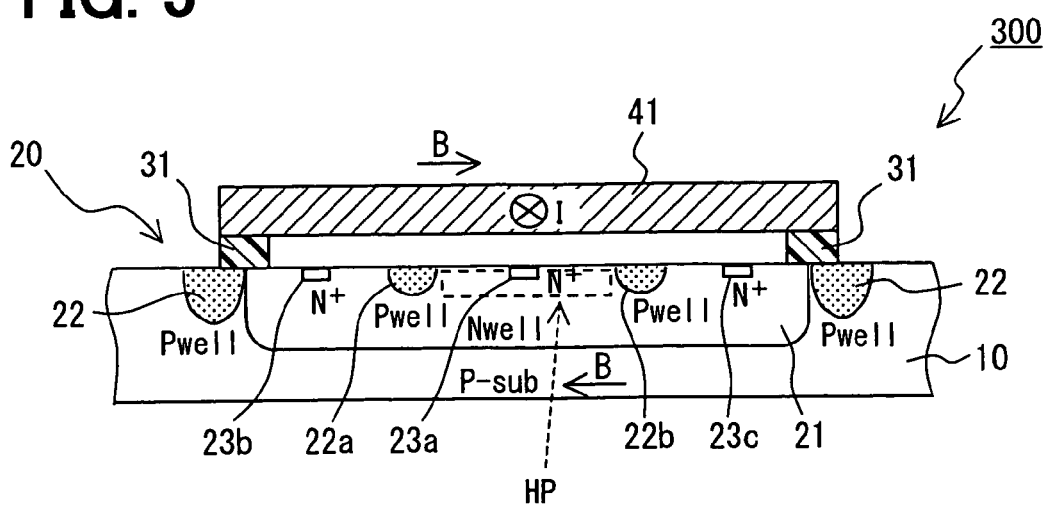
FIG. 5 is a cross sectional view showing a current sensor according to a third embodiment of the present invention.

A current sensor 300 according to a third embodiment of the present invention is shown in FIG. 5. The sensor 300 includes a wiring portion 41 as a current path. The wiring portion 41 is disposed over the substrate 10 through an insulation member 31. Specifically, the insulation member 31 has a frame shape, and is made of insulation material such as resin. The insulation member 31 is bonded to and fixed on the surface of the substrate 10. The wiring member 41 is bonded to an opposite side of the insulation member 31, the opposite side which is opposite to the substrate 10. The wiring member 41 is formed from a metallic plate such as a copper plate. The metallic plate is processed to be a predetermined shape so that the wiring member 41 is formed.

In this case, the wiring member 41 is integrally formed on the semiconductor substrate 10 through the insulation member 31 without using the semiconductor process.

The present disclosure has the following aspects.

According to an aspect of the present disclosure, a current sensor for detecting a detection object current includes: a current path for flowing the detection object current therethrough; a semiconductor substrate; and a Hall element disposed on a front side of the semiconductor substrate. The Hall element is capable of detecting a magnetic flux generated by a magnetic field, which is caused by the detection object current when the detection object current flows through the current path. The Hall element generates a Hall voltage corresponding to the magnetic flux when a driving current flowing in a direction perpendicular to the semiconductor substrate is supplied to the Hall element, and when the magnetic flux having a component parallel to the semiconductor substrate affects the Hall element. The current path is disposed on the front side or a back side of the semiconductor substrate. The current path is electrically isolated from the Hall element.

In the above sensor, the Hall element is a vertical type Hall element, and the sensor can detect the detection object current without a magnetic field concentration member. Thus, the dimensions of the sensor are minimized. Further, the positioning between the Hall element and the current path is much accurately determined. Thus, deviation of the positioning between the Hall element and the current path is restricted. Thus, the detection accuracy of the sensor is prevented from deviating. Accordingly, the sensor has small dimensions and high detection accuracy.

Alternatively, the current path may be integrally coupled with the semiconductor substrate in such a manner that the current path is disposed on the front or back side of the semiconductor substrate through an insulation member in order to isolate from the Hall element. In this case, the positioning between the current path and the Hall element is accurately set to be a predetermined position. Further, by controlling the thickness of the insulation member, the distance between the current path and the Hall element is accurately controlled, so that the magnetic flux caused by the detection object current is accurately detected by the Hall element.

Alternatively, the insulation member may be an insulation film, and the current path is a wiring portion. In this case, the Hall element and the wiring portion as the current path can be formed on the same substrate by using a semiconductor process. Accordingly, the positioning between the Hall element and the current path is much accurately controlled. Thus, detection accuracy of the sensor is improved, and the manufacturing method of the sensor is simplified. Further, the wiring portion may be integrated with the semiconductor substrate through the insulation film, and the wiring portion may be disposed on the front side of the semiconductor substrate.

Alternatively, the Hall element may include a Hall plate as a magnetic flux detection portion, to which the driving current is supplied. The current path may cover the Hall plate in a plane surface of the front side of the semiconductor substrate. In this case, the Hall element can detect the magnetic flux having the component parallel to the substrate stably.

Alternatively, the sensor may further include: a processing circuit portion for controlling the Hall element. The processing circuit portion is integrally disposed on the semiconductor substrate. In this case, the total dimensions of the sensor can be much reduced.

Alternatively, the Hall element is a vertical type Hall element. The Hall element includes a semiconductor region, a separation wall, a first to third current supply terminals and a first and second voltage output terminals. The semiconductor region is disposed in a surface portion of the semiconductor substrate. The separation wall includes a frame, a first wall and a second wall. The frame of the separation wall surrounds the semiconductor region. The first wall and the second wall are disposed in the frame of the separation wall so that the semiconductor region is divided into a first to third element regions. Each of the first and second walls has a depth, which is shallower than a depth of the semiconductor region so that the first to third element regions are electrically connected together through a part of the semiconductor region under each of the first and second walls. The first current supply terminal is disposed in the first element region, the second current supply terminal and the first and second voltage output terminals are disposed in the second element region, and the third current supply terminal is disposed in the third element region. The first and second voltage output terminals are disposed line symmetrically with a pair of the first and third current supply terminals. The second current supply terminal is disposed at a center between the first and second voltage output terminals. The Hall element includes a Hall plate as a magnetic flux detection portion. The Hall plate is provided by a part of the second element region surrounded with the first and second voltage output terminals. The driving current is supplied to the Hall plate through a pair of the first and second current supply terminals and/or a pair of the second and third current supply terminals. The Hall voltage is outputted from the first and second voltage output terminals. Further, the first to third current supply terminals and the first and second voltage output terminals may be disposed on the front side of the semiconductor substrate. The first to third current supply terminals may be disposed on a line, and the first and second voltage output terminals and the second current supply terminal may be disposed on another line. The current path is in parallel to the another line, and the current path is perpendicular to the line. Furthermore, the semiconductor substrate may have a first conductive type, the semiconductor region may have a second conductive type, and the separation wall may have the first conductive type. Further, the current path may be a wiring portion disposed on the front side of the semiconductor substrate through an insulation film so that the wiring portion is electrically isolated from the Hall element. The wiring portion may be made of metallic film, the insulation film may be made of an oxide film, and the semiconductor substrate may be made of silicon.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A current sensor for detecting a detection object current comprising:

a current path for flowing the detection object current therethrough;

a semiconductor substrate; and a Hall element disposed on a front side of the semiconductor substrate, wherein the Hall element is capable of detecting a magnetic flux generated by a magnetic field, which is caused by the detection object current when the detection object current flows through the current path, the Hall element generates a Hall voltage corresponding to the magnetic flux when a driving current flowing in a direction perpendicular to the semiconductor substrate is supplied to the Hall element, and when the magnetic flux having a component parallel to the semiconductor substrate affects the Hall element, the current path is disposed on the front side or a back side of the semiconductor substrate, and the current path is electrically isolated from the Hall element, wherein:

the Hall element is a vertical type Hall element, the Hall element includes a semiconductor region, a separation wall, a first to third current supply terminals and a first and second voltage output terminals, the semiconductor region is disposed in a surface portion of the semiconductor substrate, the separation wall includes a frame, a first wall and a second wall, the frame of the separation wall surrounds the semiconductor region, the first wall and the second wall are disposed in the frame of the separation wall so that the semiconductor region is divided into a first to third element regions, each of the first and second walls has a depth, which is shallower than a depth of the semiconductor region so that the first to third element regions are electrically connected together through a part of the semiconductor region under each of the first and second walls, the first current supply terminal is disposed in the first element region, the second current supply terminal and the first and second voltage output terminals are disposed in the second element region, and the third current supply terminal is disposed in the third element region, the first and second voltage output terminals are disposed line symmetrically with a pair of the first and third current supply terminals, the second current supply terminal is disposed at a center between the first and second voltage output terminals, the Hall element includes a Hall plate as a magnetic flux detection portion, the Hall plate is provided by a part of the second element region surrounded with the first and second voltage output terminals, the driving current is supplied to the Hall plate through a pair of the first and second current supply terminals and/or a pair of the second and third current supply terminals, and the Hall voltage is outputted from the first and second voltage output terminals.

2. The sensor according to claim 1, wherein
the current path is integrally coupled with the semiconductor substrate in such a manner that the current path is disposed on the front or back side of the semiconductor substrate through an insulation member in order to isolate from the Hall element.

3. The sensor according to claim 2, wherein
the insulation member is an insulation film, and
the current path is a wiring portion.

4. The sensor according to claim 3, wherein
the wiring portion is integrated with the semiconductor substrate through the insulation film, and
the wiring portion is disposed on the front side of the semiconductor substrate.

5. The sensor according to claim 1, wherein
the Hall element includes a Hall plate as a magnetic flux detection portion, to which the driving current is supplied, and
the current path covers the Hall plate in a plane surface of the front side of the semiconductor substrate.

6. The sensor according to claim 1, further comprising:
a processing circuit portion for controlling the Hall element, wherein
the processing circuit portion is integrally disposed on the semiconductor substrate.

7. The sensor according to claim 1 wherein
the first to third current supply terminals and the first and second voltage output terminals are disposed on the front side of the semiconductor substrate,
the first to third current supply terminals are disposed on a line,
the first and second voltage output terminals and the second current supply terminal are disposed on another line,
the current path is in parallel to the another line, and
the current path is perpendicular to the line.

8. The sensor according to claim 7, wherein
the semiconductor substrate has a first conductive type,
the semiconductor region has a second conductive type, and
the separation wall has the first conductive type.

9. The sensor according to claim 8, wherein
the current path is a wiring portion disposed on the front side of the semiconductor substrate through an insulation film so that the wiring portion is electrically isolated from the Hall element,
the wiring portion is made of metallic film,
the insulation film is made of an oxide film, and
the semiconductor substrate is made of silicon.

* * * * *